United States Patent [19]

Lee

[11] Patent Number: 5,428,405
[45] Date of Patent: Jun. 27, 1995

[54] APPARATUS FOR FINELY ADJUSTING TUNING DATA FOR A TELEVISION RECEIVER AND THE METHOD THEREOF

[75] Inventor: Jae K. Lee, Taegu, Rep. of Korea

[73] Assignee: Goldstar Co., Ltd., Seoul, Rep. of Korea

[21] Appl. No.: 214,966

[22] Filed: Mar. 14, 1994

[30] Foreign Application Priority Data

Mar. 13, 1993 [KR] Rep. of Korea ............... 93-3817

[51] Int. Cl.⁶ .................... H04N 5/50; H04N 5/44
[52] U.S. Cl. ........................ 348/731; 348/569; 348/732; 348/734
[58] Field of Search ............ 348/569, 731, 732, 734, 348/714, 715; H04N 5/50, 5/44

[56] References Cited

U.S. PATENT DOCUMENTS

| | | | |
|---|---|---|---|
| 4,271,434 | 6/1981 | Sakamoto | 348/732 |
| 4,805,230 | 2/1989 | Tanaka | 348/731 |
| 5,237,443 | 8/1993 | Kurisu et al. | 348/732 |

Primary Examiner—James J. Groody
Assistant Examiner—Nina N. West
Attorney, Agent, or Firm—Helfgott & Karas

[57] ABSTRACT

An apparatus and method of fine adjustment of tuning data for a TV receiver which can achieve fine adjustment of tuning data quickly and accurately. The apparatus includes a AFT information memory for storing AFT information on the detuned frequency of a selected channel, and a microcomputer for reading the corresponding AFT information of the selected channel from the AFT information memory and providing tuning data by calculating the read AFT information and a center frequency of the selected channel. The microcomputer also performs search operation if the broadcasting signal of the selected channel is inaccurately tuned in order to detect the detuned frequency thereof. The apparatus is also provided with a fine adjustment key for increasing/decreasing the tuning data so as to perform accurate tuning. The tuning data increased/decreased by the fine adjustment key is then stored in the AFT information memory for use in the next tuning.

2 Claims, 5 Drawing Sheets

| BIT | LOGIC STATE | CONTENTS |
|---|---|---|
| 7TH BIT | 0 | AUTO. MEMORY MODE |
|  | 1 | MANUAL MEMORY MODE |
| 6TH BIT | 0 | DETUNED IN A '-' DIRECTION |
|  | 1 | DETUNED IN A '+' DIRECTION |
| 5TH - 0TH BITS |  | FINE ADJUSTMENT DATA OF A DETUNED FREQUENCY |

APPARATUS FOR FINELY ADJUSTING TUNING DATA FOR A TELEVISION RECEIVER AND THE METHOD THEREOF

BACKGROUND OF THE INVENTION

1. Field of the Invention

The present invention generally relates to fine tuning of television (TV) broadcasting signals, and more particularly to an apparatus for finely adjusting tuning data for a TV receiver and the method thereof which can finely adjust the tuning data of a selected channel automatically and/or manually when especially a detuned broadcasting signal or a broadcasting signal having a strong/weak electric field is tuned, so that a user can enjoy a clear picture when selecting a channel. 2. Description of the Prior Art A conventional apparatus for finely adjusting tuning data for a TV receiver is shown in FIG. 1. The conventional apparatus comprises a microcomputer 1 for controlling the tuning of television broadcasting signals by outputting tuning data and for controlling the display of OSD (on-screen display) characters, a remote control receiver 2 for entering function key signals to the microcomputer 1, a key pad 3 for manually entering function key signals to the microcomputer 1, a tuner section 4 for selecting and tuning a channel broadcasting signal among channel broadcasting signals inputted through an antenna ANT in accordance with the tuning data inputted from the microcomputer 1, an intermediate frequency (IF) processing section 5 for IF-processing the output signal of the tuner section 4 and for detecting a sync signal and an automatic fine tuning(AFT) signal of the channel broadcasting signal to output the detected sync and AFT signals to the microcomputer 1, an image processing section 6 for processing an image signal outputted from the IF processing section 5, an OSD character generating section 7 for generating an OSD .character signal under the control of the microcomputer 1, and a mixing section 8 for mixing the output signals of the image processing section 6 and the OSD character generating section 7 to output the mixed signal to a color cathode-ray tube (CRT) 9.

The conventional apparatus as constructed above operates as follows:

When a channel selection key signal is entered to the microcomputer 1 by the user's manipulation of the remote control transmitter or of the key pad 3, the microcomputer 1 outputs to the tuner section 4 the tuning data of the channel selected according to the entered channel selection key signal. The tuner section 4 selects and tunes the channel broadcasting signal among the broadcasting signals received through the antenna in accordance with the tuning data inputted thereto, and then the IF processing section 5 processes the output signal of the tuner section 4. Also, the IF processing section 5 detects a sync signal from the output signal of the tuner section 4 and detects an AFT signal resulting from the tuned state. The detected sync signal and the AFT signal are inputted to the microcomputer 1.

The microcomputer 1 discriminates whether the channel broadcasting signal selected by the user has been tuned or not, depending on the sync signal inputted from the IF processing section 5. That is, if the sync signal is inputted, the microcomputer 1 discriminates if the broadcasting signal is accurately tuned, depending on the level of the AFT signal. If the level of the AFT signal deviates from a predetermined range of level the microcomputer 1 performs automatic fine adjustment operation by varying the tuning data outputted to the tuner section. 4.

The level of the AFT signal outputted from the IF processing section 5 varies according to the tuning state of the broadcasting signal. The microcomputer 1 recognizes that the selected broadcasting signal is accurately tuned when the level of the detected AFT signal is within a predetermined range of level, which centers the intermediate level of the AFT signal. When the level of the detected AFT signal deviates from the predetermined range, the microcomputer recognizes that the selected broadcasting signal is inaccurately tuned.

Meanwhile, in order to achieve an accurate tuning of the selected channel broadcasting signals, the microcomputer 1 performs a broadcasting signal search with respect to 3 divided search regions, i.e., a first search region of fo $\pm 1$ MHz, where fo is the center frequency of one broadcasting signal having a frequency band of 6 MHz, a second search region of (fo$-1.5$)$\pm 1$ MHz, and a third search region of (fo$+1.5$)$\pm 1$ MHz. That is, the microcomputer 1 outputs a phase locked loop (PLL) data as a tuning data for fo when firstly tuning the selected channel, and if the level of the AFT signal inputted to the microcomputer according to the tuning data for fo is not within a predetermined range of level, the microcomputer 1 performs a search operation by outputting tuning data within the first search region. If the level of the AFT signal is still not within the predetermined range until the search operation within the first search region has been completed, the microcomputer 1 then performs a search operation with respect to the second and third search regions in turn. If the AFT signal level is still not within the predetermined range until the search operation within the first to third search regions has been completed, the microcomputer 1 recognizes that the selected channel has no broadcasting signal and thus finishes the automatic fine adjustment operation after outputting the tuning data for fo.

The tuned broadcasting signal of the selected channel is inputted to the IF processing section 5 to be IF-processed, the image signal outputted from the IF processing section 5 is processed by the image processing section 6, and then the processed image signal is outputted to the mixing section 8. Meanwhile, the OSD character generating section 7 generates the OSD character signal under the control of the microcomputer 1 and the generated OSD character .signal is outputted to the mixing section 8 to be mixed with the image signal from the image processing section 6. The mixed image signal and the OSD character signal are then outputted to the CRT 9 to be displayed on its screen.

However, such a conventional apparatus for fine adjustment of tuning data suffers from the disadvantage in that, though an accurate tuning may be effected .when the broadcasting signal the selected channel is found within the first search region, flickering may occur in the picture during conversion of search region from the first search-region to the second search region and/or from the second search region to the third search region when the broadcasting signal is found within the second or third search region, because the fine adjustment of tuning data is performed by successively searching the broadcasting signal of the selected channel within the first to third search regions. Further, if the determination region of the AFT signal level is incorrectly adjusted even when the broadcasting signal is detected by the search operation, the broadcasting signal of the selected channel may not be accurately tuned, causing the picture quality to deteriorate, giving inconvenience to the user.

SUMMARY OF THE INVENTION

It is an object of the present invention to provide an apparatus for finely adjusting tuning data for a TV receiver and the method thereof which can accurately tune the broadcasting signal having a detuned frequency with respect to a selected channel.

It is another object of the present invention to provide an apparatus for finely adjusting tuning data for a TV receiver and the method thereof which can tune the broadcasting signal of a selected channel quickly and thus can prevent the picture from flickering by successively performing a broadcasting signal search operation if the broadcasting signal of the selected channel is not accurately tuned, and by calculating and storing the detuned frequency detected by the search operation so that the stored data can be used in the next tuning.

It is still another object of the present invention to provide an apparatus for finely adjusting tuning data for a TV receiver and the method thereof which can accurately tune the broadcasting signal of a selected channel even when the determination region of the AFT signal level is incorrectly adjusted by increasing and/or decreasing tuning data by means of a manual fine adjustment key and by storing the increased or decreased tuning data to use the same data in the next tuning.

In order to achieve the above objects, the present invention provides an apparatus for finely adjusting tuning data for a television receiver, which comprises:

- a microcomputer for controlling tuning of a broadcasting signal of a selected channel by providing tuning data;
- a tuner for tuning said broadcasting signal of said selected channel in accordance with said tuning data provided by said microcomputer;
- an intermediate frequency processing means for intermediate-frequency-processing said broadcasting signal of said selected channel provided from said tuner and for detecting a sync signal and an automatic fine tuning (AFT) signal from said broadcasting signal from said tuner to provide said sync signal and said automatic fine tuning signal to said microcomputer;
- an automatic fine tuning information memory means for storing automatic fine tuning information data for a detuned frequency with respect to said broadcasting signal of said selected channel under the control of said microcomputer; and
- a fine adjustment key, connected to said microcomputer, for manually increasing and/or decreasing said tuning data provided from said microcomputer to said tuner;
- wherein said microcomputer provides said tuning data by calculating center frequency data of said selected channel and said automatic fine tuning information data provided from said automatic fine tuning information memory means, and said tuning data provided by said microcomputer are increased and/or decreased in accordance with entry of said fine adjustment key to said microcomputer.

The present invention also provides a method of finely adjusting tuning data for a television receiver, which comprises the steps of:

1) discriminating an automatic/manual memory mode by reading out automatic fine tuning information on a selected channel when the channel is selected;
2) calculating and providing the tuning data by utilizing center frequency data of the selected channel and the automatic fine tuning information when the manual memory mode is discriminated at step 1);
3) calculating and providing the tuning data by utilizing the center frequency data of the selected channel and said automatic fine tuning information and then detecting the level of an actual automatic fine tuning signal obtained from the selected channel broadcasting signal; and
4) performing search operation with the tuning data being varied if the level of the automatic fine tuning signal is not within the range of a predetermined level at step 3), while storing the automatic fine tuning information according to the current tuning data for use in the next tuning if the level of the automatic fine tuning signal is within the range of the predetermined level at step 3).

BRIEF DESCRIPTION OF THE DRAWINGS

The above objects and other features of the present invention will become more apparent by describing the embodiment thereof with reference to the accompanying drawings, in which.

DETAILED DESCRIPTION OF THE PREFERRED EMBODIMENTS

Figure 3:
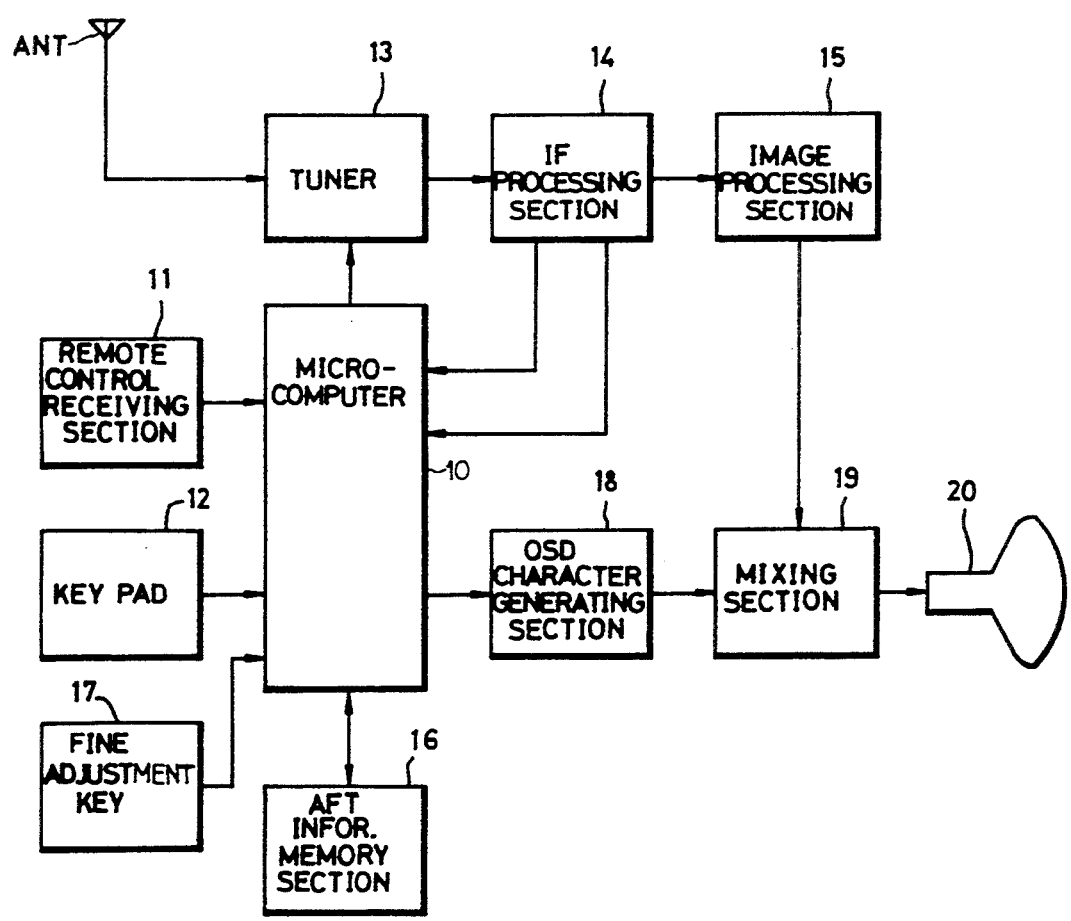
FIG. 3 is a schematic block diagram showing an embodiment of the apparatus for fine adjustment of tuning data according to the present invention.

FIG. 3 shows an embodiment of the apparatus for finely adjusting tuning data according to the present invention. Referring to FIG. 3, the present apparatus comprises a microcomputer 10 for controlling the tuning of TV broadcasting signals by providing tuning data of the selected channel and for controlling the display of OSD characters, a remote control receiving section 11 and a key pad 12 for manually entering function key signals to the microcomputer 10, a tuner 13 for tuning one of the channel broadcasting signals received through an antenna ANT in accordance with the tuning data from the microcomputer 10, an IF processing section 14 for If-processing the channel broadcasting signal from the tuner 13 and detecting a sync signal and an AFT signal of the channel broadcasting signal to provide the detected signals to the microcomputer 10, and an image processing section 15 for processing a video signal from the IF processing section 14.

The present apparatus also includes an AFT information memory section 16 for storing and providing an AFT information at the detuned frequency for the respective channel broadcasting signals which are received under the control of the microcomputer 10, a fine adjustment key 17 for manually increasing and/or decreasing the tuning data from the microcomputer 10, an OSD character generating section 18 for generating an OSD character signal under the control of the microcomputer 1, and a mixing section 19 for mixing the signals from image processing section 15 and OSD character generating section 18 to provide the mixed signal to a color CRT 20.

Figures 4, 5:
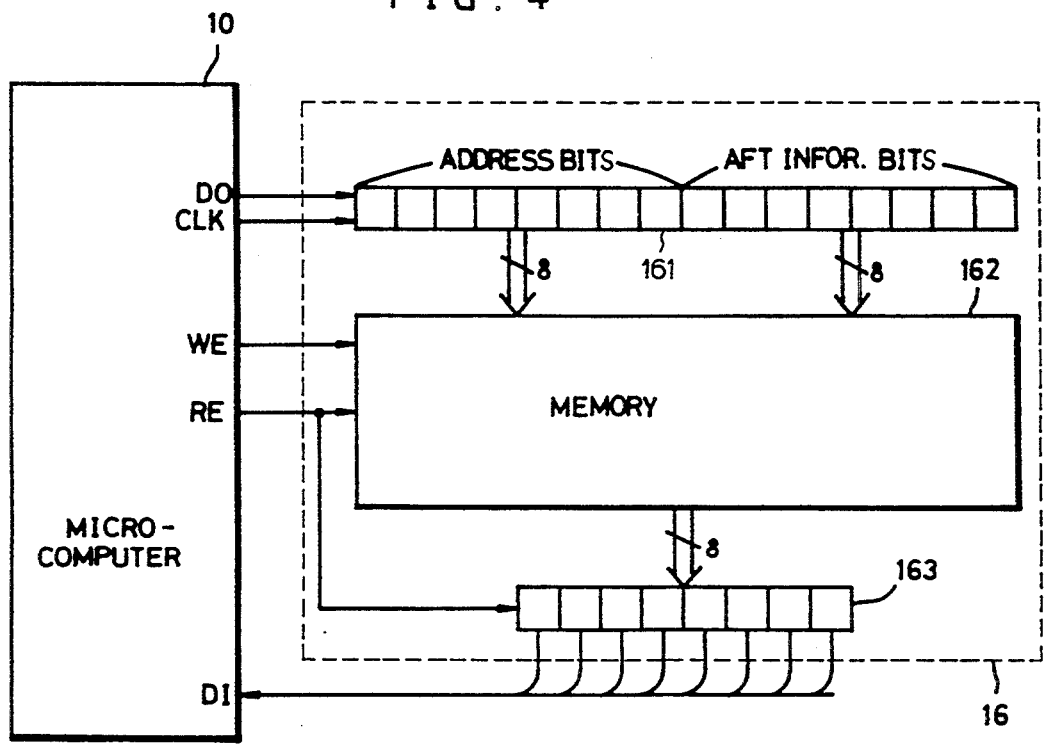
FIG. 4 is a schematic block diagram showing the internal construction of the AFT information memory section in FIG, 3.
FIG. 5 is a table explaining the contents of the data stored in the AFT information section in FIG. 3.

Referring to FIG. 4, the AFT information memory section 16 comprises a series to parallel shift register 161 for converting the address signal and AFT information signal provided from the microcomputer in series into parallel signals in accordance with a clock signal CLK, a memory 162 for storing the AFT information signal at the address determined by the address signal from the series to parallel shift register 161 in accordance with the write enable signal WE and then providing the stored AFT information signal according to the read enable signal RE, and a buffer 163 for temporarily storing the AFT information signal from the memory 162 and providing the signal to the microcomputer 10.

In this case, the AFT information signal to be stored in and provided to the memory 162 of the AFT information memory section 16 has a 8-bit construction.

That is, referring to FIG. 5, the 7th bit indicates depending on its logic state whether the memory mode is an automatic memory mode or an manual memory mode and the 6th bit indicates depending on its logic state whether the signal is detuned from the center frequency in a '−' direction or in a '+' direction and the 5th to 0th bits show the fine adjustment data of a detuned frequency.

The apparatus for finely adjusting tuning data and the method thereof according to the present invention constructed as above will be explained in detail with reference to FIG. 3 to FIG. 9.

Figure 6:
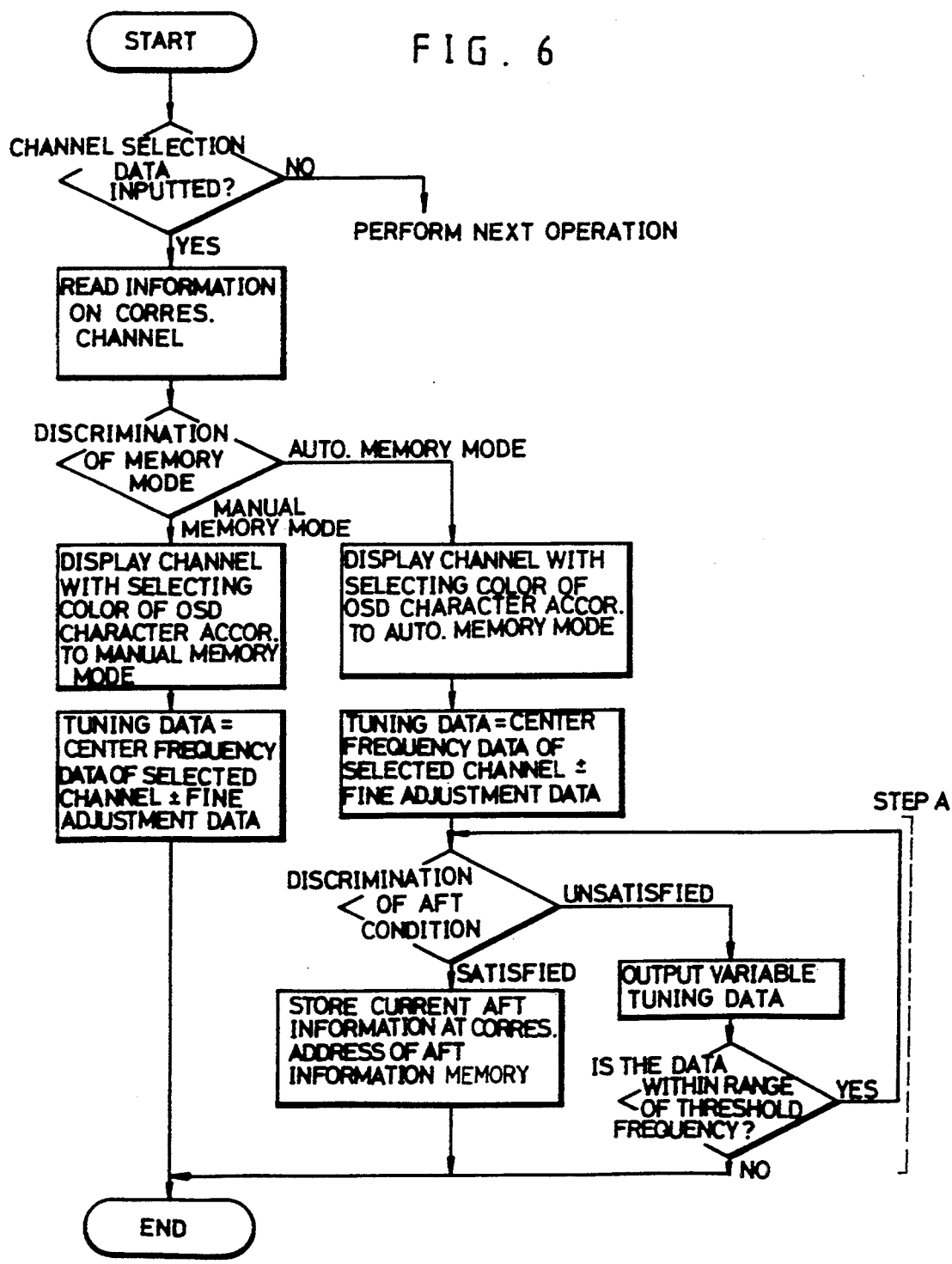
FIG. 6 is an algorithm diagram explaining the method of finely adjusting tuning data according to the present invention.

When a channel selection key is entered to the microcomputer 10 by the user's manipulation of the remote control receiving section 11 or the key pad (12) microcomputer 10 determines if the channel selection data is entered and reads AFT information on corresponding channel of AFT information memory section 16, as shown in FIG. 6.

That is, after the series-to-parallel shift register 161 receives the address signal on corresponding channel through output terminal DO and the clock signal CLK from the microcomputer 10, it shifts the address signal in accordance with the clock signal CLK. When address signal is completely shifted, microcomputer enables the memory 162 to read by providing the read enable signal RE and also enables the buffer 163. At this time, memory 162 provides the AFT information signal stored in the address corresponding to the address signal which is outputted in parallel from series-to-parallel shift register 161 and thus the AFT information enters the input terminal DI of the microcomputer 10 through the buffer 163.

As described above, when microcomputer 10 reads the AFT information on the channel selected by a user, it determines by the 7th bit of the AFT information whether the memory is in the automatic memory mode or in the manual memory mode. If the memory is in the manual memory mode, the microcomputer selects the color of the OSD character depending on the manual memory mode and outputs the OSD character of the selected channel with the selected color so that the character signal from the character generating section 18 can be displayed on the color CRT 20 by way of the mixing section 19. Microcomputer then calculates the tuning data.

That is, microcomputer determines according to the 6th bit of the read AFT information whether the frequency is detuned in a "+" direction or in a "−" direction and then calculates the tuning data by adding and/or subtracting the fine adjustment data of the 5th to 0th bits to and/or from the center frequency data of selected channel according to the determined detuning direction. The calculated tuning data is provided to the tuner 13.

When the tuner 13 receives the tuning data calculated by the microcomputer 10 as described above, it tunes and provides a broadcasting signal in accordance with the tuning data. The IF processing section 14 then IF processes the output signal of tuner 13 and provides it as a video signal. In addition, the microcomputer 10 detects a sync signal and an AFT signal from the video signal and thus indicates that the tuning of the broadcasting signal according to the tuning data is completed. The video signal from IF processing section 14 is image processed by image processing section 15 and is mixed with OSD character signal at the mixing section 19 so that the mixed signal is displayed on the screen by way of color CRT 19.

Meanwhile, if the logic state of the 7th bit of the AFt information which is read by microcomputer 10 is "0", i.e., the memory is in the automatic memory mode, the channel is displayed with the selected color of the OSD character according to the automatic memory mode. That is, the microcomputer selects the OSD character with a color different from that of the manual memory mode and displays a channel on the color CRT 20 under the control OSD character generating section 18 and then calculates the tuning data to provide it to the tuner 13, thereby tuning the broadcasting signal.

Furthermore, after tuning, microcomputer determines the level of the AFT signal which is provided from the IF processing section 14.

IF an AFT condition is unsatisfied, the microcomputer outputs the tuning data to be variable and then determines whether the tuning data is within the range of the threshold frequency on the current channel. If the tuning data is within the range of the threshold frequency a search operation is continued until the AFT condition is satisfied.

When the AFT condition is met, the microcomputer stores the current AFT information in the corresponding address by controlling the AFT information memory section 16, which allows the current channel to be employed in the next tuning operation.

That is, the 7th bit of AFT information has "0" logic state indicating the automatic memory mode and the 6th bit becomes "0" or "1" according to the detuned direction for the center frequency on the current channel and the 5th to the 0th bits becomes the fine adjustment data. The AFT information and the corresponding address signal are provided from the output terminal DO of the microcomputer 10 to the series/parallel shift register 161 so as to be shifted. When the shifting is completed, the write enable signal WE causes the memory to be write-enabled so that the AFT information is stored in the corresponding address.

Figure 1:
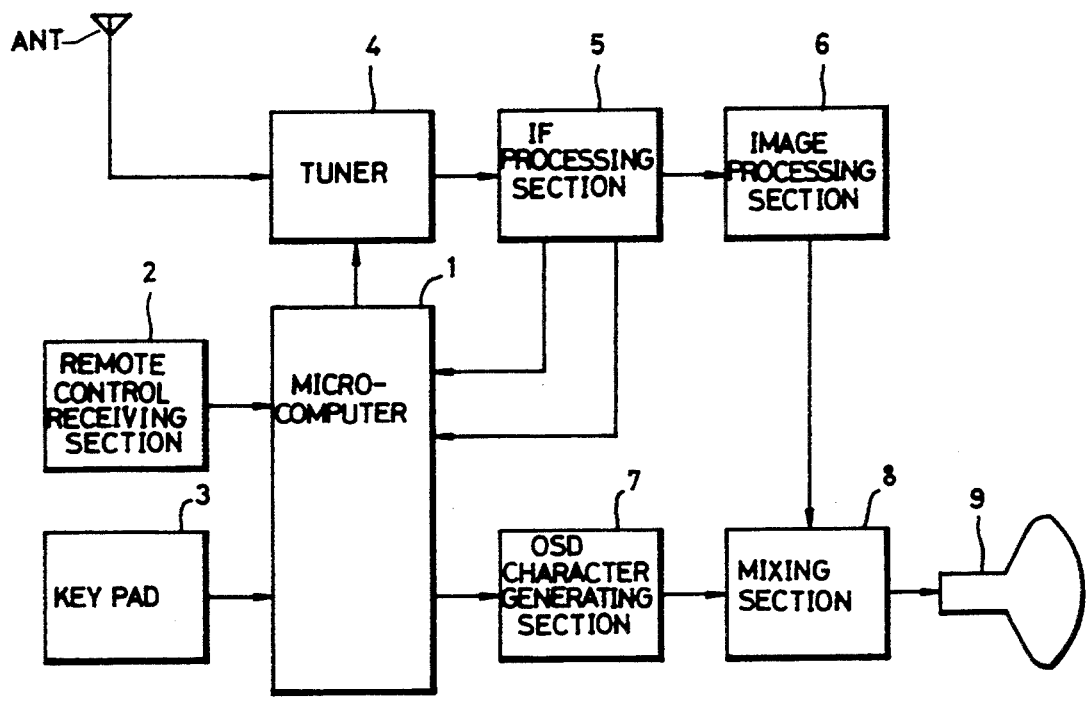
FIG. 1 is a schematic block diagram of a conventional apparatus for fine adjustment of tuning data.
Figure 2:
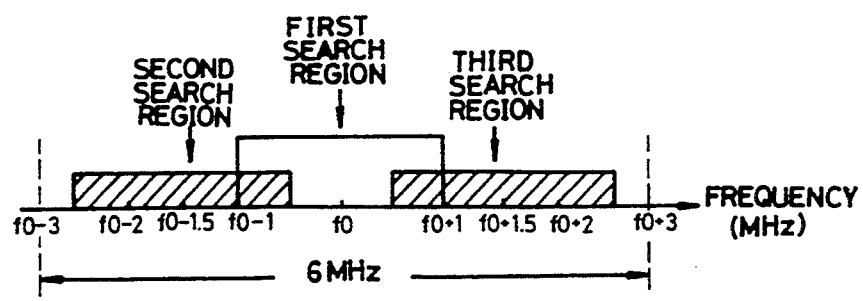
FIG. 2 is a view explaining search regions of tuning data provided from the microcomputer in FIG. 1.

IF a user intends to select the channel in which the AFT information data was previously stored, the microcomputer reads the AFT information from the corresponding memory address shown in FIG. 4 and directly determines the tuning data depending on the read data and accordingly performs the step A shown in FIG. 6, while the conventional apparatus performs the sequential search operation as shown in the FIG. 2. Therefore, the present apparatus removes the blinking due to the gap between the search regions.

Figure 7:
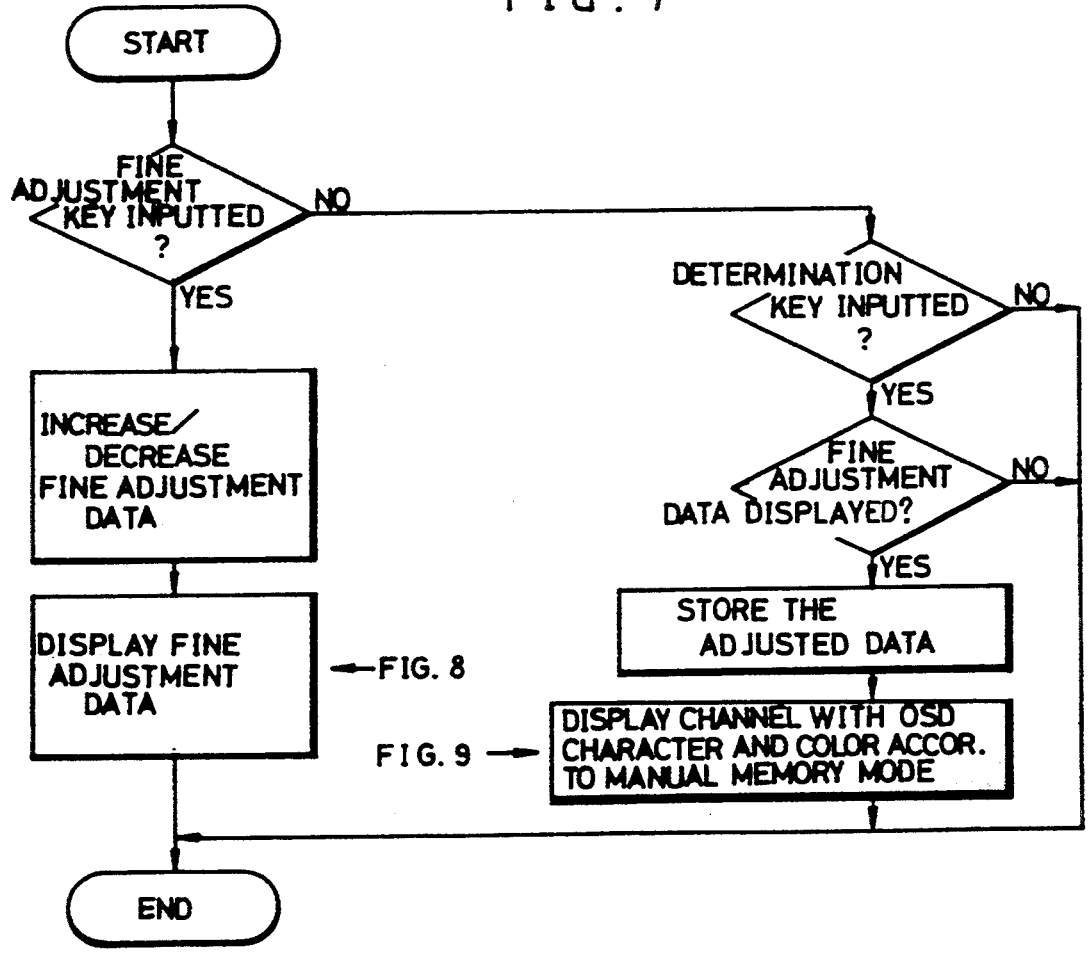
FIG. 7 is an algorithm diagram explaining the manual fine adjustment method in detail as a part of the fine adjustment method according to the present invention.
Figure 8:
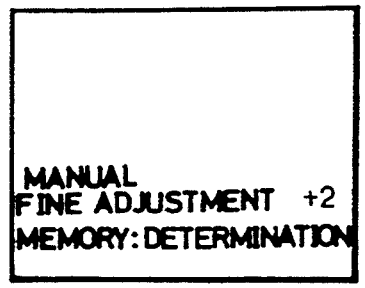
FIG. 8 shows an example of an OSD display state during manual fine adjustment of tuning data according to the present invention.
Figure 9:
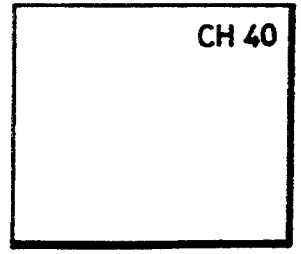
FIG. 9 shows an example of a selected channel display state during manual fine adjustment of tuning data according to the present invention.

Meanwhile, the fine adjustment key 17 is manually pressed when the broadcasting signal on the selected channel is being tuned as stated above, the fine adjustment data is increased and/or decreased as shown in FIG. 7 and then is displayed on the screen as shown in FIG. 8. IF the fine adjustment is not entered, the microcomputer determines whether the determination key is inputted or not when the determination key is pressed, the microcomputer determines if the fine adjustment data is displayed as shown in FIG. 8. If so, the microcomputer adjusts and stores the fine adjustment data and then displays the channel with OSD character and color according to the manual memory mode as shown in FIG. 9.

If the determination key is not entered and the fine adjustment data is not displayed, the routine ends depending on the other external keys.

From the foregoing, according to the present apparatus, the AFT information on the respective channels are stored and the broadcasting signal of the selected channel is tuned by providing the tuning data in accordance with the stored AFT information on the corresponding channel, thereby quickly performing the tuning operation with respect to the broadcasting signal of a selected channel without flickering on the screen even though the frequency of the broadcasting signal may be detuned.

If addition, especially when the search region for the AFT signal level is determined incorrectly or a broadcasting signal having a strong/weak electric field is tuned, the broadcasting signal can be accurately tuned by varying the tuning data in accordance with the user's manipulation.

What is claimed is:

1. An apparatus for finely adjusting tuning data for a television receiver, comprising:
   a microcomputer for controlling tuning of a broadcasting signal of a selected channel by providing tuning data;
   a tuner for tuning said broadcasting signal of said selected channel in accordance with said tuning data provided by said microcomputer;
   an intermediate frequency processing means for intermediate-frequency-processing said broadcasting signal of said selected channel to detect a sync signal and an automatic fine tuning signal from said broadcasting signal from said tuner and to provide said sync signal and said automatic fine tuning signal to said microcomputer;
   an automatic fine tuning information memory means for storing, automatic fine tuning information data for a detuned frequency with respect to said broadcasting signal of said selected channel under the control of said microcomputer; and
   a fine adjustment key, connected to said microcomputer, for manually increasing and/or decreasing said tuning data provided from said microcomputer to said tuner;
   wherein said microcomputer provides said tuning data by calculating center frequency data of said selected channel and said automatic fine tuning information data provided from said automatic fine tuning information memory means, and said tuning data provided by said microcomputer are increased and/or decreased in accordance with entry of said fine adjustment key to said microcomputer,
   wherein said automatic fine tuning information memory means comprises:
      a series-to-parallel shift register for converting address data and said automatic fine tuning information data provided in series from said microcomputer into parallel signals, respectively;
      a memory for storing said automatic fine tuning information data at an address thereof determined by said address data provided from said shift register in accordance with a write enable signal from said microcomputer, and providing said stored automatic fine tuning information data in accordance with a read enable signal from said microcomputer; and
      a buffer for temporarily storing said automatic fine tuning information data to provide said information data to said microcomputer.

2. An apparatus for finely adjusting tuning data for a television receiver comprising:
   a microcomputer for controlling tuning of a broadcasting signal of a selected channel by providing tuning data;
   a tuner for tuning said broadcasting signal of said selected channel in accordance with said tuning data provided by said microcomputer;
   an intermediate frequency processing means for intermediate-frequency-processing said broadcasting signal of said selected channel to detect a sync signal and an automatic fine tuning signal from said broadcasting signal from said tuner and to provide said sync signal and said automatic fine tuning signal to said microcomputer;
   an automatic fine tuning information memory means for storing automatic fine tuning information data for a detuned frequency with respect to said broadcasting signal of said selected channel under the control of said microcomputer; and
   a fine adjustment key, connected to said microcomputer for manually increasing and/or decreasing said tuning data provided from said microcomputer to said tuner;
   wherein said microcomputer provides said tuning data by calculating center frequency data of said selected channel and said automatic fine tuning information data provided from said automatic fine tuning information memory means, and said tuning data provided by said microcomputer are increased and/or decreased in accordance with entry of said fine adjustment key to said microcomputer,
   wherein said automatic fine tuning information data are composed of 8 bits in which a seventh bit thereof represents an automatic/manual memory mode according to its logic state, a sixth bit thereof represents a positive/negative detuned direction from a center frequency, and fifth to 0th bits represent fine adjustment data of a detuned frequency.

* * * * *